US011051436B2

(12) United States Patent
Daskalakis et al.

(10) Patent No.: US 11,051,436 B2
(45) Date of Patent: Jun. 29, 2021

(54) MODULAR PRINTED CIRCUIT BOARD SEPARATION TOOL

(71) Applicant: Intel Corporation, Santa Clara, CA (US)

(72) Inventors: George H. Daskalakis, Forest Grove, OR (US); Reed D. Vilhauer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/728,732

(22) Filed: Dec. 27, 2019

(65) Prior Publication Data

US 2020/0137934 A1 Apr. 30, 2020

(51) Int. Cl.
*H05K 13/00* (2006.01)
*H01R 12/70* (2011.01)
*B25B 27/04* (2006.01)

(52) U.S. Cl.
CPC ......... *H05K 13/0007* (2013.01); *B25B 27/04* (2013.01); *H01R 12/7023* (2013.01); *H05K 2201/09063* (2013.01)

(58) Field of Classification Search
CPC ..... H05K 13/0007; H05K 2201/09603; H01R 12/7023
USPC .......................................................... 439/79
See application file for complete search history.

(56) References Cited

U.S. PATENT DOCUMENTS

| | | | | |
|---|---|---|---|---|
| 4,066,316 A * | 1/1978 | Rollings | ............... | H01R 4/2433 439/404 |
| 6,293,946 B1 * | 9/2001 | Thorne | ............... | A61B 18/1442 606/48 |
| 6,688,920 B2 * | 2/2004 | Lehner | ................. | H01R 4/2433 439/417 |
| 7,288,952 B2 * | 10/2007 | Goto | ................... | G01R 1/06722 324/755.05 |
| 8,800,879 B2 * | 8/2014 | Fischer | ................ | H05K 7/1469 235/492 |
| 9,004,953 B2 * | 4/2015 | Finona | ............... | H01R 13/6473 439/660 |
| 9,252,506 B2 * | 2/2016 | Acera | ................... | H01R 4/2429 |
| 9,276,342 B2 * | 3/2016 | Masubuchi | ........ | H01R 13/6471 |
| 10,205,259 B2 * | 2/2019 | Wang | .................... | H01R 12/772 |
| 10,320,096 B2 * | 6/2019 | Huntley | ............. | H01R 12/7076 |
| 10,422,816 B2 * | 9/2019 | Chen | ......................... | H05K 7/10 |
| 2013/0243106 A1* | 9/2013 | Toba | ....................... | H01R 43/26 375/257 |

* cited by examiner

*Primary Examiner* — Alexander Gilman
(74) *Attorney, Agent, or Firm* — Patent Capital Group

(57) ABSTRACT

Particular embodiments described herein provide for an electronic device that can be configured to enable a modular printed circuit board separation tool. The separation tool can include a main body and a plurality of separation blades that extend from the main body. Each of the plurality of separation blades can be tapered and configured to fit between connections of a testing housing and a power and signal supply housing and when pressure is applied to the main body, the separation blades slide between the connections of the testing housing and the power and signal supply housing and separate the testing housing and the power and signal supply housing.

16 Claims, 18 Drawing Sheets

MODULAR PRINTED CIRCUIT BOARD SEPARATION TOOL

TECHNICAL FIELD

This disclosure relates in general to the field of computing, and more particularly, to a separation tool.

BACKGROUND

Emerging trends in systems place increasing performance demands on the system. The increasing demands require components of a system to be developed and modified to handle the increasing demands. To test the developed and modified components, modular testing boards are created that can be reused for multiple tests.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1A:
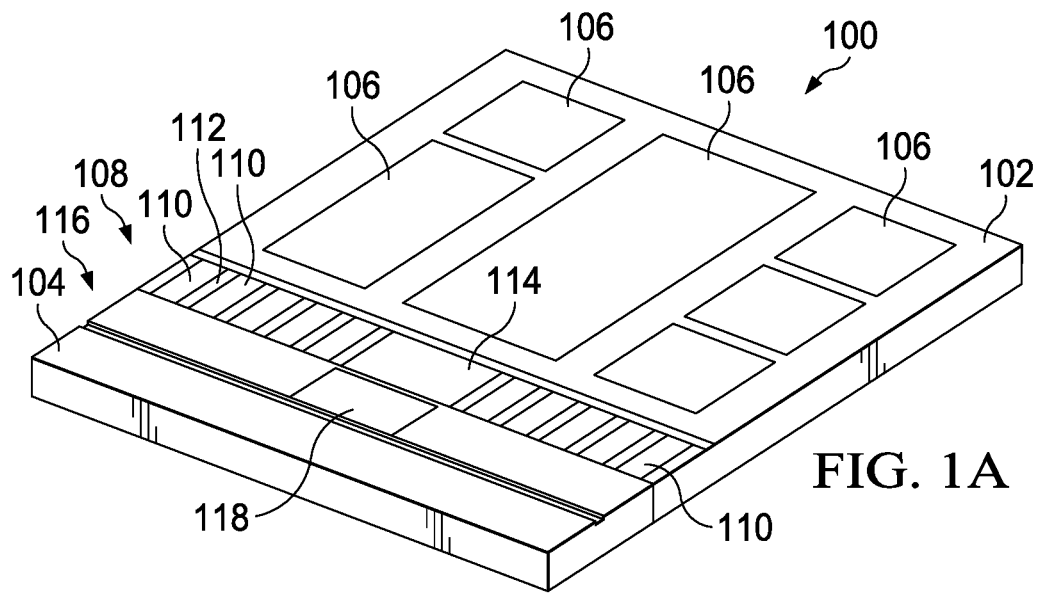
FIG. 1A is a simplified block diagram of a system to enable a separation tool, in accordance with an embodiment of the present disclosure.

The FIGURES of the drawings are not necessarily drawn to scale, as their dimensions can be varied considerably without departing from the scope of the present disclosure.

DETAILED DESCRIPTION

EXAMPLE EMBODIMENTS

The following detailed description sets forth examples of apparatuses, methods, and systems relating to enabling a separation tool. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one element, component, or layer disposed over or under another element, component, or layer may be directly in contact with the other element, component, or layer or may have one or more intervening elements, components, or layers. Moreover, one element, component, or layer disposed between two elements, components, or layers may be directly in contact with the two elements, components, or layers or may have one or more intervening elements, components, or layers. In contrast, a first element, component, or layer "on" a second element, component, or layer is in direct contact with that second element, component, or layer. Similarly, unless explicitly stated otherwise, one feature disposed between two features may be in direct contact with the adjacent features or may have one or more intervening elements, components element, component, or, or layers.

Implementations of the embodiments disclosed herein may be formed or carried out on a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

FIG. 1A is a simplified block diagram of a device 100 that includes a testing housing 102 and a power and signal supply housing 104. Power and signal supply housing 104 can be configured to provide power and signals to testing housing 102. Testing housing 102 can include one or more testing components 106 and a test housing connection area 108. Test housing connection area 108 can include a plurality of blades 110 with a blade gap 112 between each of the plurality of blades 110 in test housing connection area 108. Each of blades 110 can be a power receiving blade. Test housing connection area 108 can also include a test housing signal connection 114. Power and signal supply housing 104 can include a power and signal supply connection area 116 and a supply signal connection 118.

In an example, one or more of testing components 106 on testing housing 102 can be prototype components, development parts, etc. of an electronic device. Power and signal supply housing 104 can be configured to provide power and signals to one or more of testing components 106 on testing housing 102. Power and signal supply housing 104 can be coupled to testing housing 102, testing can be performed, and power and signal supply housing 104 can be separated from testing housing 102 and used on a different testing housing or different testing components 106 can be added to testing housing 102 or one or more of testing components 106 can be modified and tested again.

Power and signal supply connection area 116 can be coupled to test housing connection area 108 to provide the power and signals (e.g., digital signals, analog signals, clocks, communications, testing parameters, etc.) to one or more of testing components 106 on testing housing 102. The coupling of test housing connection area 108 and power and signal supply connection area 116 can be relatively strong and it is often difficult to separate testing housing 102 and power and signal supply housing 104. Often, when separating testing housing 102 and power and signal supply housing 104, connections in power and signal supply connection area 116 can become bent or damaged.

Figure 1B:
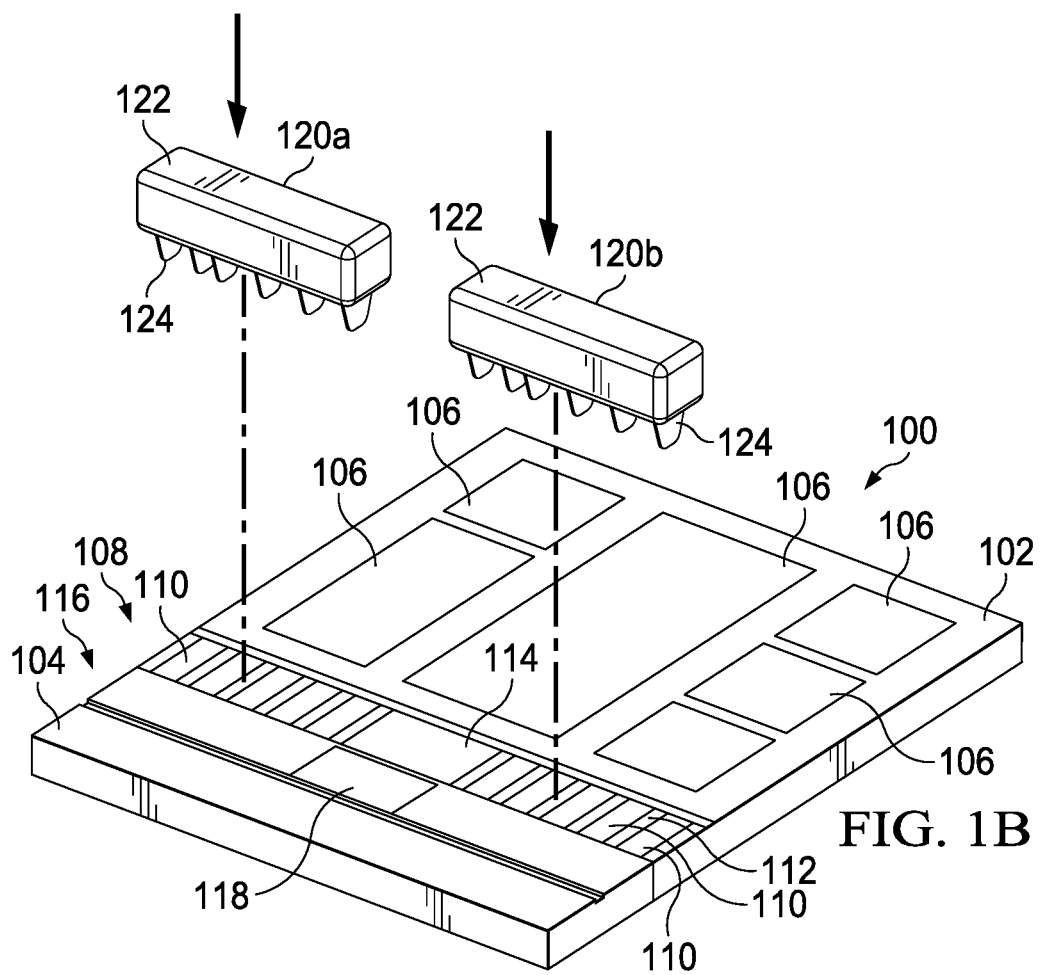
FIG. 1B is a simplified block diagram of a system to enable a separation tool, in accordance with an embodiment of the present disclosure.

Turning to FIG. 1B, FIG. 1B is a simplified block diagram of a device 100 that includes testing housing 102 and power and signal supply housing 104. Testing housing 102 can include one or more testing components 106 and test housing connection area 108. Test housing connection area 108 can include plurality of blades 110 with blade gap 112 between each of the plurality of blades 110 in test housing connection area 108. Test housing connection area 108 can also include test housing signal connection 114. Power and signal supply housing 104 can include power and signal supply connection area 116 and supply signal connection 118. When test housing connection area 108 on testing housing 102 is coupled to power and signal supply connection area 116 on power and signal supply housing 104, the connection can be relatively strong and it is often relatively difficult to separate testing housing 102 and power and signal supply housing 104 without damaging connections in power and signal supply connection area 116. In an example, a separation tool can be used to help separate testing housing 102 and power and signal supply housing 104 in a uniform manner without damaging connections in test housing connection area 108 and power and signal supply connection area 116.

As illustrated in FIG. 1B, separation tools 120a and 120b can be used to help separate testing housing 102 and power and signal supply housing 104 without damaging connections in power and signal supply connection area 116. Each of separation tools 120a and 120b can include a main body 122 and a plurality of separation blades 124. Each of plurality of separation blades 124 can include a tapered or wedged shaped profile be configured to be inserted into blade gap 112 between plurality of blades 110 in test housing connection area 108.

Figure 1C:
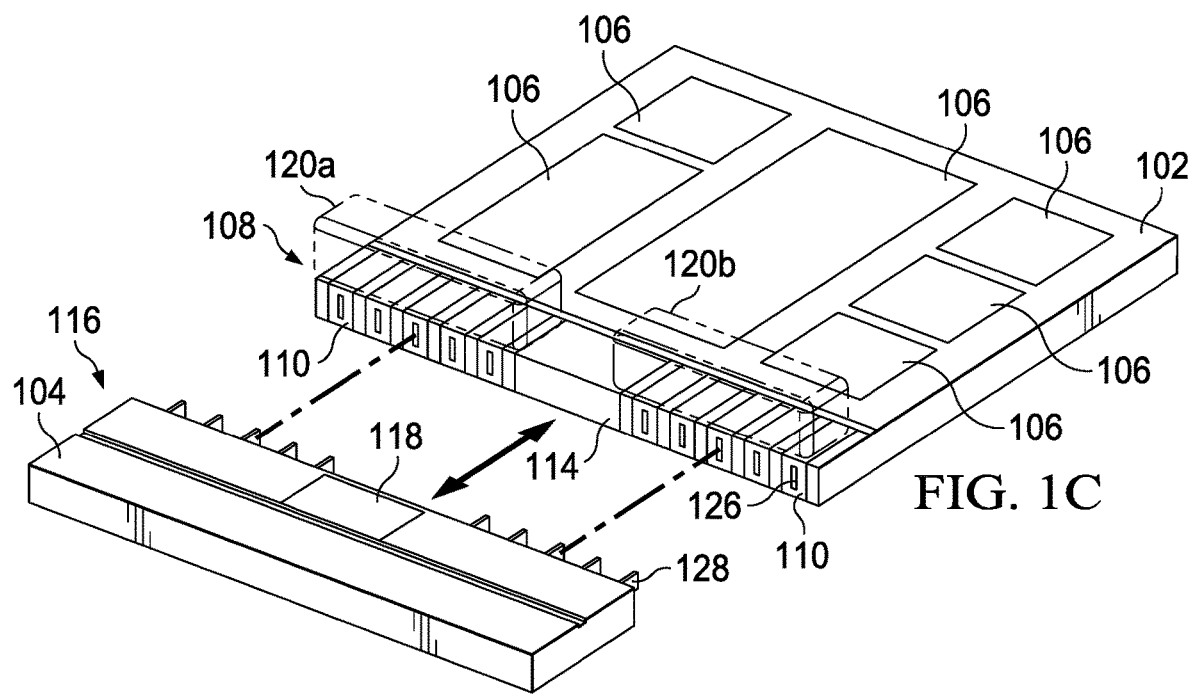
FIG. 1C is a simplified block diagram of a system to enable a separation tool, in accordance with an embodiment of the present disclosure.

Turning to FIG. 1C, FIG. 1C is a simplified block diagram of testing housing 102 being separated from power and signal supply housing 104. Testing housing 102 can include one or more testing components 106 and test housing connection area 108. Test housing connection area 108 can include plurality of blades 110 with blade gap 112 between each of the plurality of blades 110 in test housing connection area 108. Each of blades 110 can include a power receiving slot 126. Test housing connection area 108 can also include test housing signal connection 114. Power and signal supply housing 104 can include power and signal supply connection area 116. Power and signal supply connection area 116 can include supply signal connection 118 and power supply blades 128. Power supply blades 128 can be configured to couple with power receiving slot 126 and help couple and provide power to testing housing 102 from power and signal supply housing 104. Testing housing signal connection 114 can be configured to couple with supply signal connection 118 and help couple and facilitate communications between testing housing 102 and power and signal supply housing 104. When each of plurality of separation blades 124 on separation tools 120a and 120b are inserted into a blade gap (e.g., blade gap 112) between plurality of blades 110 in test housing connection area 108 and downward pressure is applied to main body 122 of separation tools 120a and 120b, testing housing 102 and power and signal supply housing 104 can be separated without damaging connections in power and signal supply connection area 116.

Figure 1D:
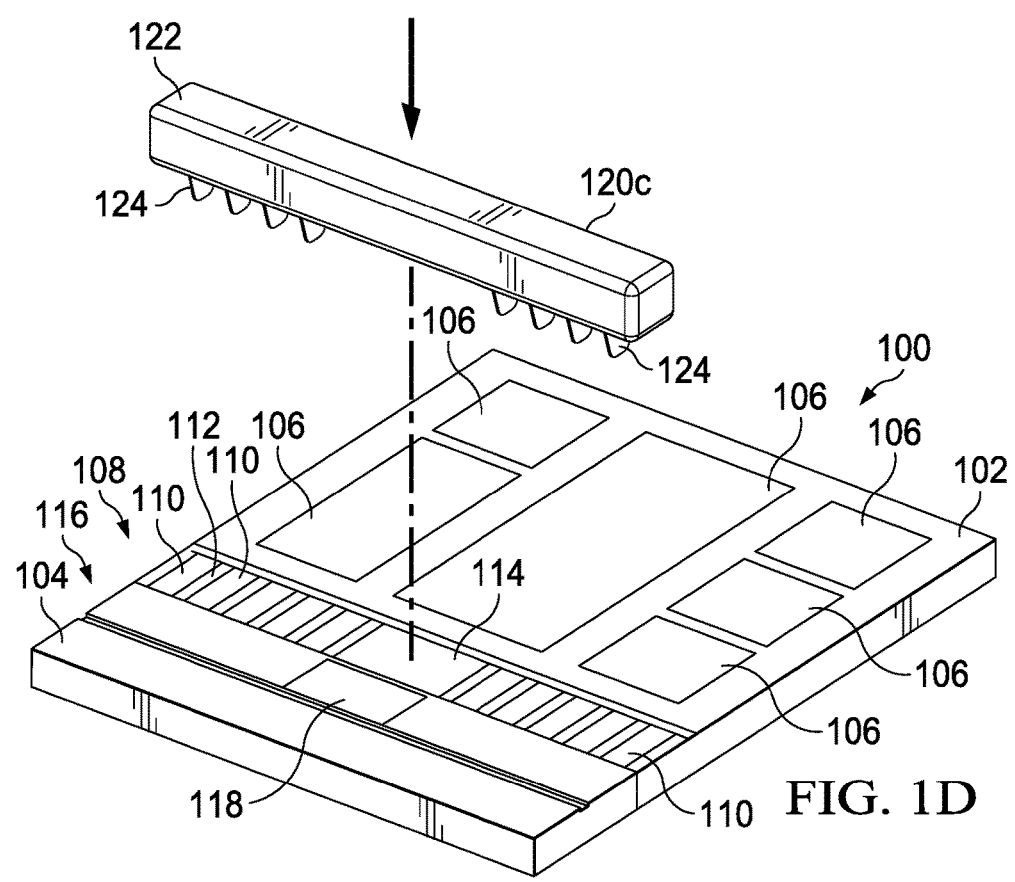
FIG. 1D is a simplified block diagram of a system to enable a separation tool, in accordance with an embodiment of the present disclosure.

Turning to FIG. 1D, FIG. 1D is a simplified block diagram of device 100 that includes testing housing 102 and power and signal supply housing 104. Testing housing 102 can include one or more testing components 106 and test housing connection area 108. Test housing connection area 108 can include plurality of blades 110 with blade gap 112 between each of the plurality of blades 110 in test housing connection area 108. Test housing connection area 108 can also include test housing signal connection 114. Power and signal supply housing 104 can include power and signal supply connection area 116. Power and signal supply connection area 116 can include supply signal connection 118. When test housing connection area 108 on testing housing 102 is coupled to power and signal supply connection area 116 on power and signal supply housing 104, the connection can be relatively strong and often it is difficult to separate testing housing 102 and power and signal supply housing 104 without damaging connections in power and signal supply connection area 116.

As illustrated in FIG. 1D, separation tool 120c can be used to help separate testing housing 102 and power and signal supply housing 104 without damaging connections in power and signal supply connection area 116. Separation tool 120c can include main body 122 and plurality of separation blades 124. Main body 122 of separation tool 120c can extend over test housing signal connection 114 and be configured as one continuous main body rather than two separate separation tools 120a and 120b as illustrated in FIG. 1C. Each of plurality of separation blades 124 can be configured to be inserted into blade gap 112 between plurality of blades 110 in test housing connection area 108.

Figure 1E:
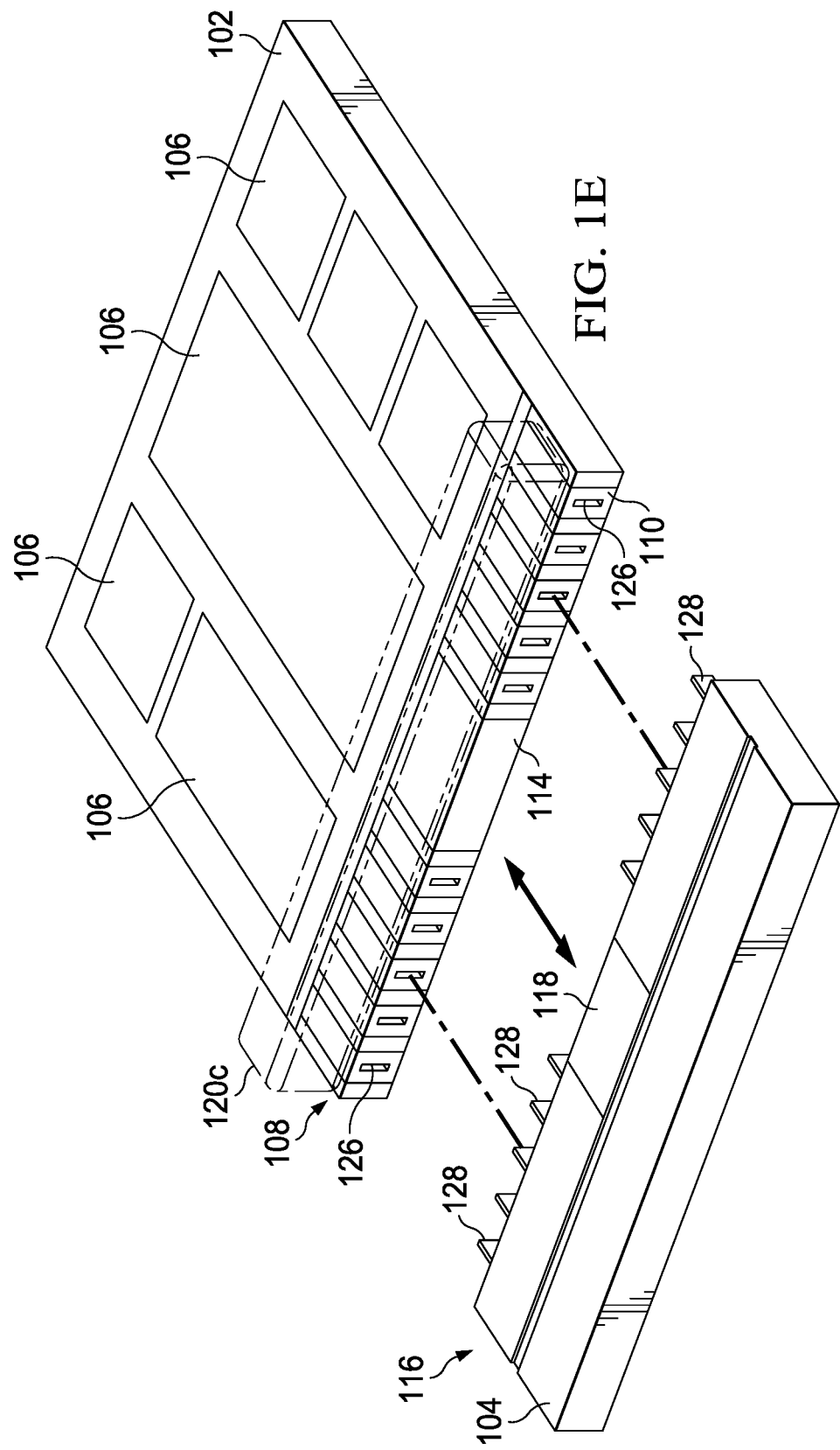
FIG. 1E is a simplified block diagram of a system to enable a separation tool, in accordance with an embodiment of the present disclosure.

Turning to FIG. 1E, FIG. 1E is a simplified block diagram of testing housing 102 being separated from power and signal supply housing 104. Testing housing 102 can include one or more testing components 106 and test housing connection area 108. Test housing connection area 108 can include a plurality of blades 110 with blade gap 112 between each of the plurality of blades 110 in test housing connection area 108. Each of blades 110 can include power receiving slot 126. Test housing connection area 108 can also include test housing signal connection 114. Power and signal supply housing 104 can include power and signal supply connection area 116. Power and signal supply connection area 116 can include supply signal connection 118 and power supply blades 128. When each of plurality of separation blades 124 on separation tool 120c are inserted into a blade gap (e.g., blade gap 112) between plurality of blades 110 in test housing connection area 108 and downward pressure is applied to main body 122 of separation tool 120c, testing housing 102 and power and signal supply housing 104 can be separated without damaging connections in power and signal supply connection area 116. Note that a separation blade does not need to be inserted into every blade gap. The number of separation blades 124 on separation tools 120a, 120b, and 120c depends on the user's preference and the amount needed to help separate testing housing 102 and power and signal supply housing 104 in a uniform manner without damaging connections in test housing connection area 108 and power and signal supply connection area 116.

Separation tools 120a, 120b, and 120c can be or include a physical tool that is used to separate and re-use modular circuit boards interconnected with high power and high-density connectors that require large separation forces. Each of plurality of separation blades 124 can be configured to include a tapered or a ramp like profile on each side that, as each of plurality of separation blades 124 is inserted into a blade gap between plurality of blades 110 in test housing connection area 108, separation tool 120a, 120b, or 120c can help to separate the connectors and testing housing 102 from power and signal supply housing 104. The number of separation blades 124 on separation tools 120a, 120b, and 120c, the spacing and thickness of separation blades 124, the angled nature of separation blades 124, and the materials used for separation blades 124 and main body 122 can be modified depending on the preferences of the user, the configuration needed to separate testing housing 102 from power and signal supply housing 104, and design constraints.

It is to be understood that other embodiments may be utilized and structural changes may be made without departing from the scope of the present disclosure. Substantial flexibility is provided in that any suitable arrangements and configuration may be provided without departing from the teachings of the present disclosure.

As used herein, the term "when" may be used to indicate the temporal nature of an event. For example, the phrase "event 'A' occurs when event 'B' occurs" is to be interpreted to mean that event A may occur before, during, or after the occurrence of event B, but is nonetheless associated with the occurrence of event B. For example, event A occurs when event B occurs if event A occurs in response to the occurrence of event B or in response to a signal indicating that event B has occurred, is occurring, or will occur. Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. As components are modified and/or created to satisfy the increasing demands on a system, the modified and/or created components are tested to ensure they perform as expected. One way to test the components is on a testing housing. A testing housing can be a modular system where one or more testing components can be replaced, configurations can be changed, supporting components can be changed, inputs can be changed, power can be controlled, etc. to test the component and its functions. A power and signal supply housing can be used to provide the power and signals to one or more of the components being tested on the testing housing. In an example, the power and signal supply housing can be coupled to the testing housing, testing can be performed, and the power and signal supply housing can be separated from the testing housing and used on a different testing housing, different components can be added to testing housing, or one or more components can be adjusted and tested again. The coupling of the testing housing and the power and signal supply housing can be relatively strong and often it is difficult to separate the testing housing and the power and signal supply housing.

More specifically, the testing housing and the power and signal supply housing typically have high power connections and high-density board to board connectors. When separating the high-power connection and the high signal density board to board connectors, there is a relatively large amount of force required to disconnect the testing housing and the power and signal supply housing. Often times, the testing housing and the power and signal supply housing will become misaligned during separation and cause damage to the connectors, connector housings, pins, boards, etc. Manually pulling the testing housing and the power and signal supply housing apart is what is typically done to separate the testing housing and the power and signal supply housing and when pulling apart the testing housing and the power and signal supply housing, the user needs to carefully pulling apart each side of the testing housing and the power and signal supply housing, alternating back and forth in order to separate them as evenly as possible. This process can be time consuming and high-risk, often resulting in damage even when the user is being overly cautious. For example, during separation of the testing housing and the power and signal supply housing, the testing housing and the power and signal supply housing can become askew and pins can bend easily in connectors. Also, parts of connectors can break off rendering the testing housing and/or the power and signal supply housing unusable. What is needed is an apparatus, system, method, etc. that can separate the testing housing and the power and signal supply housing without damaging the testing housing or the power and signal supply housing.

An apparatus, system, method, etc. that can separate the testing housing and the power and signal supply housing without damaging the testing housing or the power and signal supply housing, as outlined in FIGS. 1A-1E, can resolve these issues (and others). In an example, a separation tool (e.g., separation tool 120a, 120b, and/or 120c) can be configured to include a main body (e.g., main body 122) and a plurality of separation blades (e.g., separation blades 124).

Typically, when the testing housing is coupled to the power and signal supply housing (e.g., test housing connection area 108 on testing housing 102 is coupled to power and signal supply connection area 116 on power and signal supply housing 104), the connection includes power supply blades (e.g., power supply blades 128) on the power and signal supply housing coupling with receiving slots (e.g., power receiving slots 126) in blades on the testing housing. Because the blades and receiving slots are insulated from adjacent blades and receiving slots, there is a gap (e.g., blade gap 112) between each of the blades. Each of the separation blades on the separation tool can be configured to be inserted into a blade gap between the blades. When a downward force is applied to the separation tool, the separation blades are forced into the blade gaps and help to separate the testing housing and the power and signal supply housing without damaging the connections. Note that a separation blade does not need to be inserted into every blade gap. The number of the separation blades on the separation tool depends on the user's preference and the amount needed to help separate the testing housing and the power and signal supply housing in a uniform manner without damaging connections in the test housing connection area and the power and signal supply connection area.

The separation tool can be configured as a separator tool for disconnecting modular circuit boards with co-planar interconnects. The connectors for such boards are typically high power, high density, and have a high connection bond co-planar style. When connected, they require a relatively large amount of uniform force in order to separate them in order to be able to re-use the circuit boards that are the building blocks of the modular system concept. This uniform force needs to occur simultaneously on the two outer connector pairs on printed circuit board (PCB) edges. The separation tool can allow for high density, high retention connectors to engage and help provide a robust testing system and also allows for users to separate the connectors when needed. The separation tool allows users to apply simultaneous downward force so the user can separate the connectors (and ultimately circuit boards) evenly, can help avoid connector and board damage during separation, is reusable for thousands of cycles, is relatively easy to use, and can be relatively low cost to manufacture.

During use, the separation tool's tapered or wedged blades are inserted between the power connectors (e.g., the gaps between the blades) and pressure is applied down in order to apply leverage for board separation. Once separated, the boards can be re-used in other systems as the concept of the modular system requires. The separation tool may be two distinct separation tools or combined to one single tool with one main body for one hand operation. The separation tool can include tapered or wedged shape blades and a handle for force application. While the separation tool is illustrated being used on a Molex Ten60 family of power connectors, the separation tool can be modified for use on similar co-planar board to board connectors in modular systems with two or more partitioned circuit boards.

Figure 2:
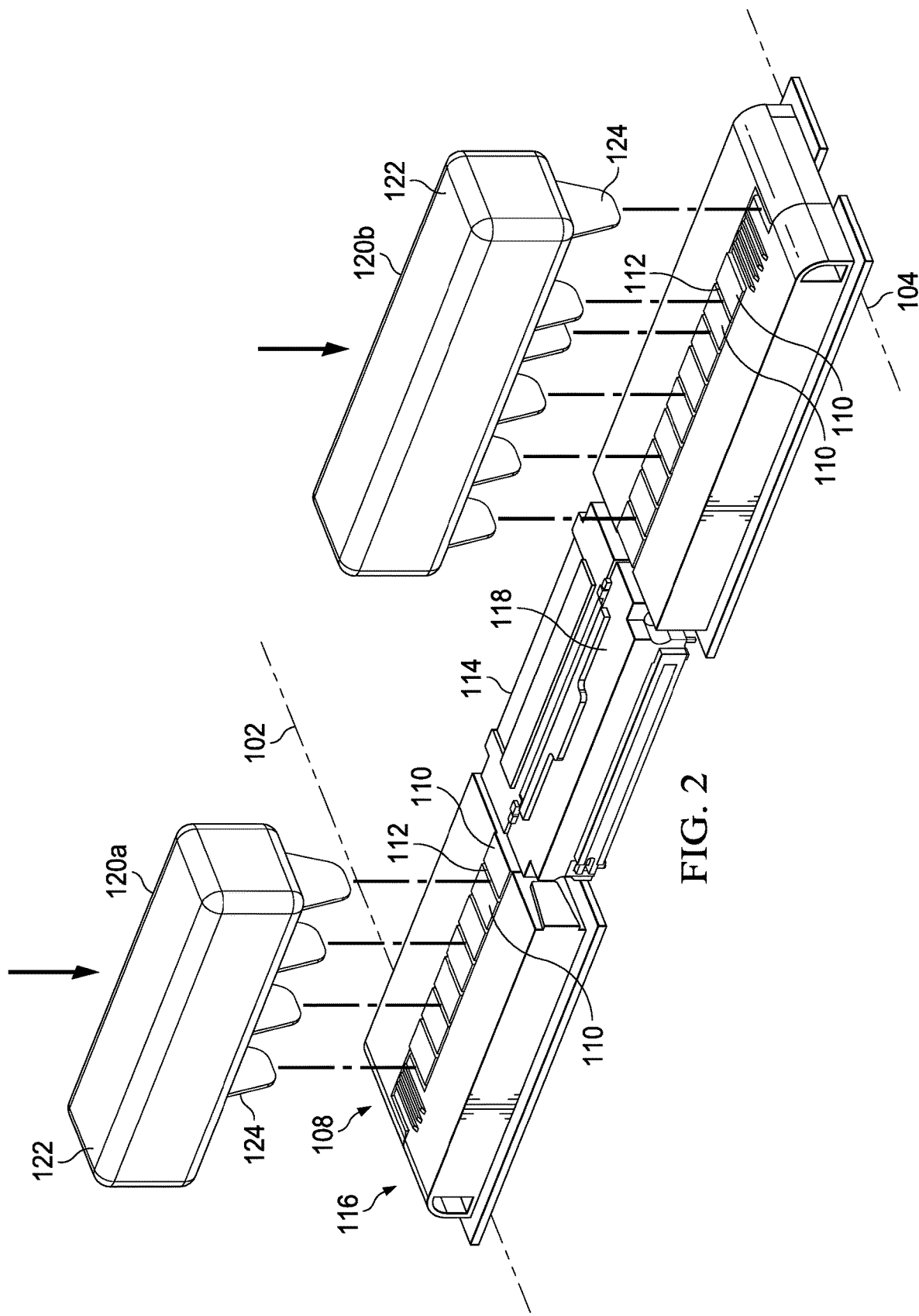
FIG. 2 is a simplified block diagram of a portion of a system to enable a separation tool, in accordance with an embodiment of the present disclosure.

Turning to FIG. 2, FIG. 2 is a simplified block diagram of a portion of testing housing 102 coupled to power and signal supply housing 104. Testing housing 102 can include test housing connection area 108. Test housing connection area 108 can include plurality of blades 110 with blade gap 112 between each of plurality of blades 110 in test housing connection area 108. Test housing connection area 108 can also include test housing signal connection 114. Power and signal supply housing 104 can include power and signal supply connection area 116. Power and signal supply connection area 116 can include supply signal connection 118. When test housing connection area 108 on testing housing 102 is coupled to power and signal supply connection area 116 on power and signal supply housing 104, the connection can be relatively strong and often it is difficult to separate testing housing 102 and power and signal supply housing 104 without damaging connections in power and signal supply connection area 116. Separation tools 120*a* and 120*b* can be used to help separate testing housing 102 and power and signal supply housing 104 without damaging connections in power and signal supply connection area 116. Each of separation tools 120*a* and 120*b* can include main body 122 and plurality of separation blades 124. Each of plurality of separation blades 124 can be configured to be inserted into blade gap 112 between plurality of blades 110 in test housing connection area 108. When a downward force is applied to main body 122 of separation tool 120*a* and 120*b*, separation blades 124 are forced into blade gaps 112 and the tapered or wedged profile of separation blades 124 can help to separate testing housing 102 and power and signal supply housing 104 without damage.

Figure 3:
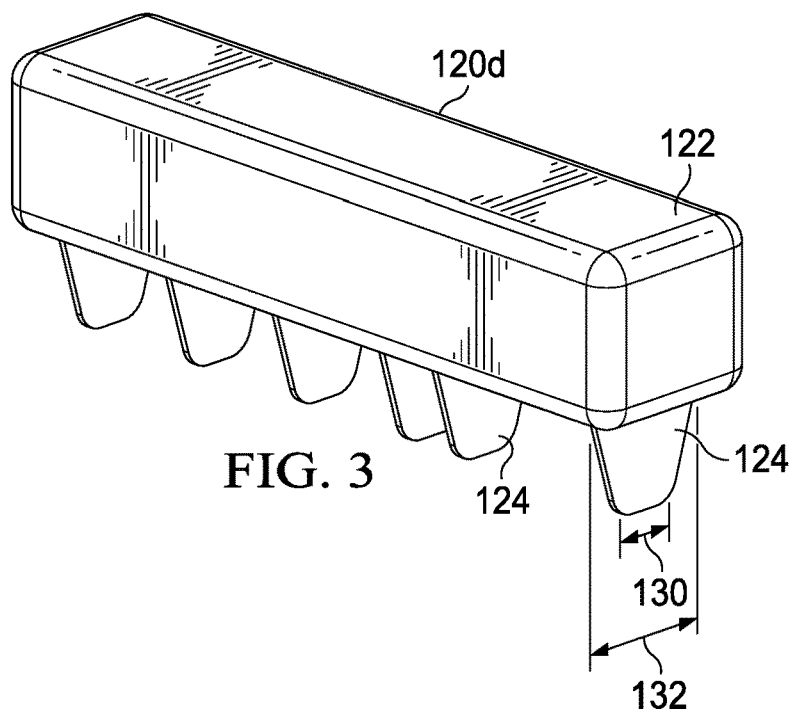
FIG. 3 is a simplified block diagram of a separation tool, in accordance with an embodiment of the present disclosure.

Turning to FIG. 3, FIG. 3 is a simplified block diagram of separation tool 120*d*. Separation tool 120*d* can include main body 122 and separation blades 124. Each of separation blades 124 can be configured to include a tapered, wedge, or a ramp like profile that, as each separation blade 124 is inserted into a blade gap between blades in test housing connection area 108, separation tool 120*d* can help to gradually separate the connectors and testing housing 102 from power and signal supply housing 104. For example, as illustrated in FIG. 3, separation blade 124 can have a bottom width 130 and a top width 132. In an example, top width 132 and bottom width 130 can have a ratio of about 1.75 to about one (1). In a specific example, bottom width 130 can be about eight (8) millimeters and top width 132 can be about 14.1 millimeters or the width needed to separate testing housing 102 from power and signal supply housing 104.

Figure 4A:
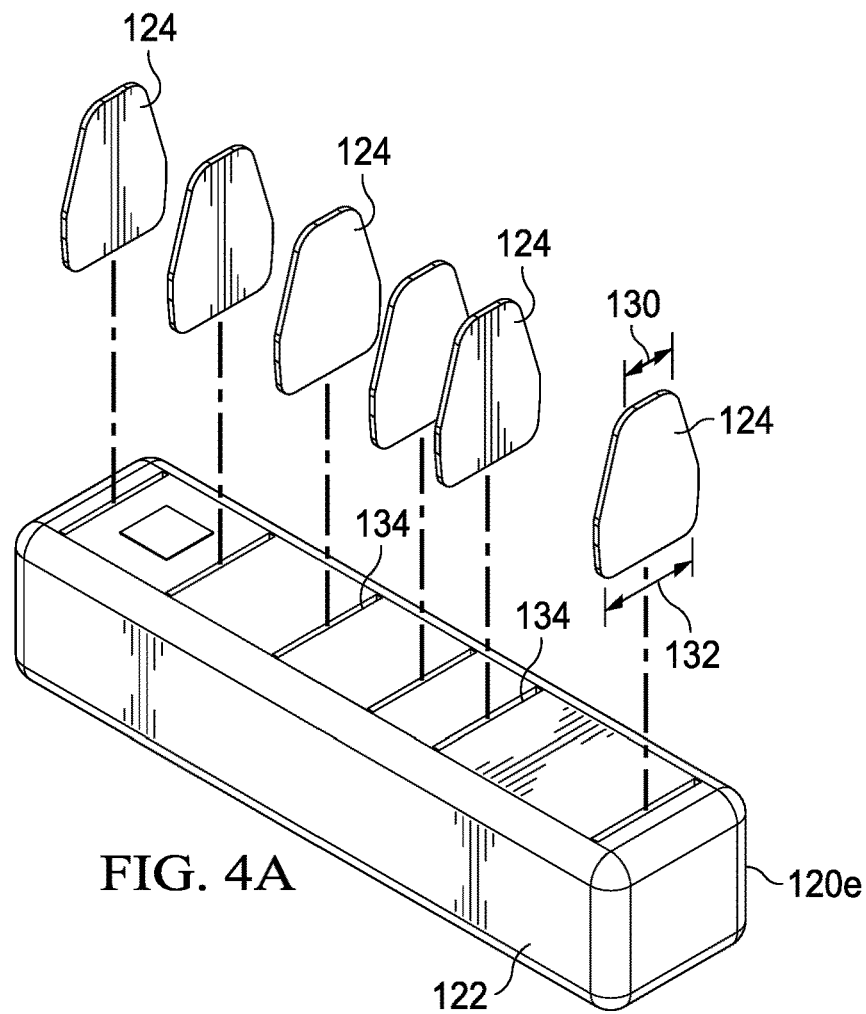
FIG. 4A is a simplified block diagram of a separation tool, in accordance with an embodiment of the present disclosure.

Turning to FIG. 4A, FIG. 4A is a simplified block diagram of separation tool 120*e*. Separation tool 120*e* can include main body 122 and a plurality of separation blade slots 134. Each separation blade slot 134 can be configured to house a separation blade 124.

Figure 4B:
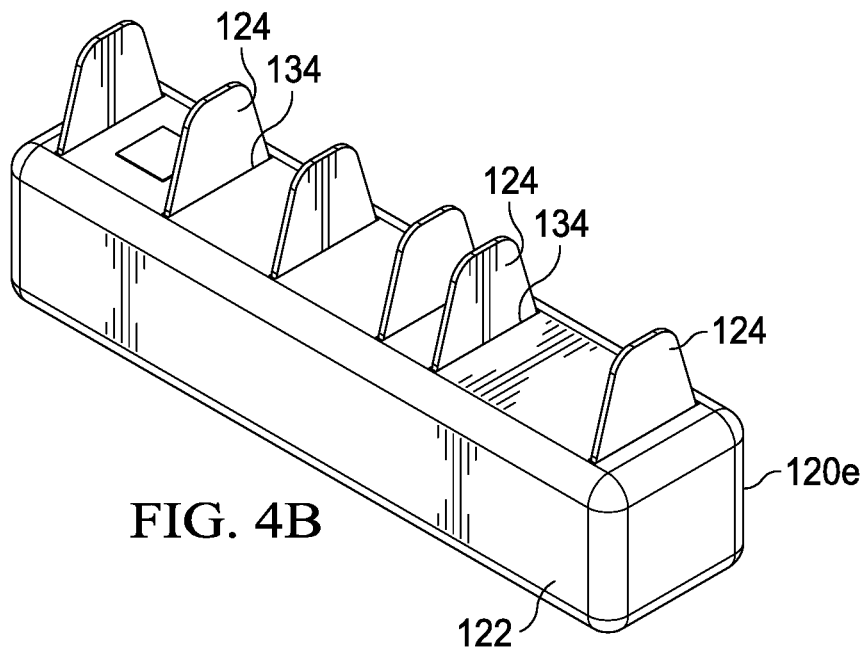
FIG. 4B is a simplified block diagram of a separation tool, in accordance with an embodiment of the present disclosure.

Turning to FIG. 4B, FIG. 4B is a simplified block diagram of separation tool 120*e*. Separation tool 120*e* can include main body 122, plurality of separation blade slots 134, and plurality of separation blades 124. When separation blade 124 is inserted into separation blade slot, separation blade slot 134 can hold separation blade 124 and help allow separation blade 124 to separate testing housing 102 and power and signal supply housing 104 without damage.

Figure 5A:
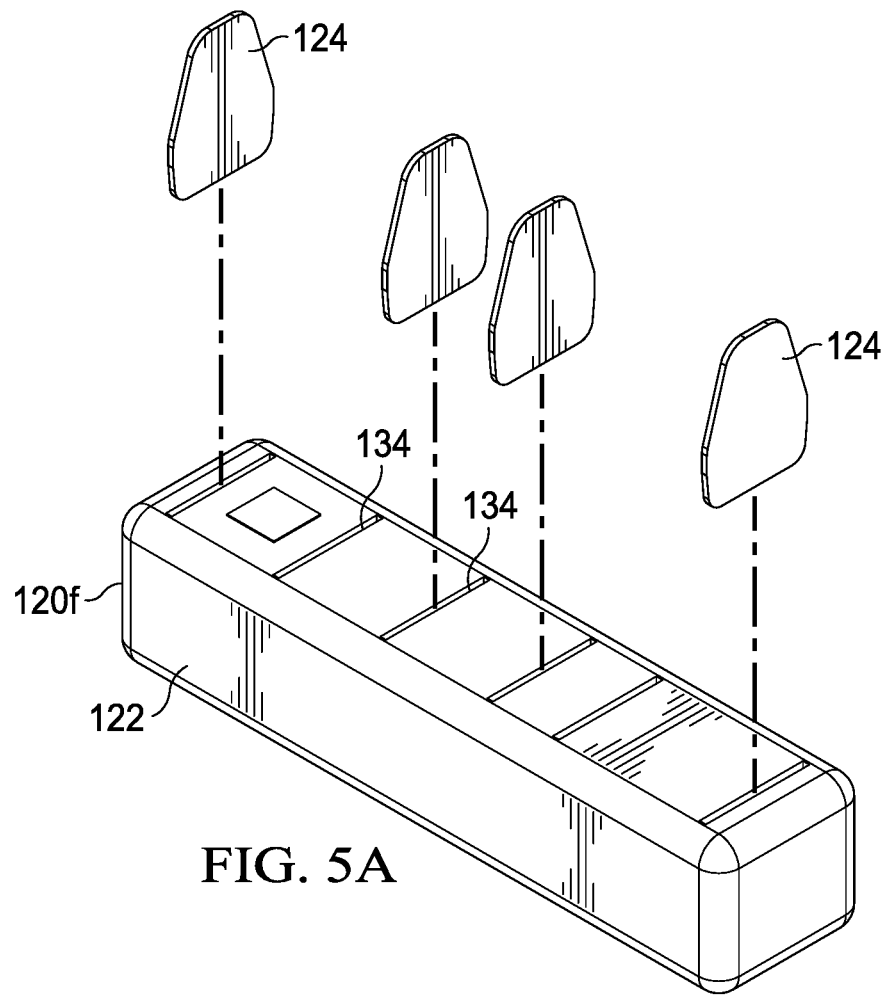
FIG. 5A is a simplified block diagram of a separation tool, in accordance with an embodiment of the present disclosure.

Turning to FIG. 5A, FIG. 5A is a simplified block diagram of separation tool 120*f*. Separation tool 120*f* can include main body 122 and plurality of separation blade slots 134. Each separation blade slots 134 can be configured to house a separation blade 124. As illustrated in FIG. 5A, not every separation blade slot 134 needs to house a separation blade 124.

Figure 5B:
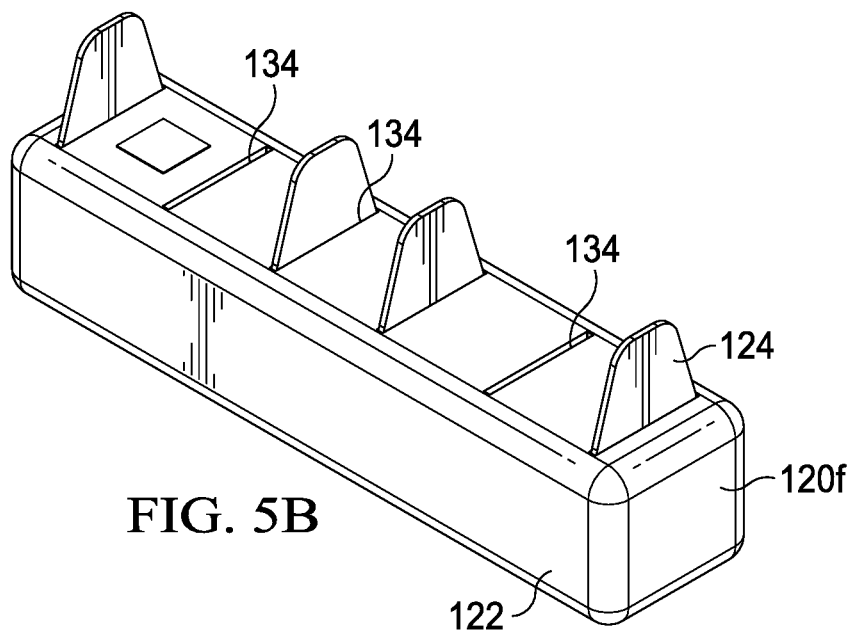
FIG. 5B is a simplified block diagram of a separation tool, in accordance with an embodiment of the present disclosure.

Turning to FIG. 5B, FIG. 5B is a simplified block diagram of separation tool 120*f*. Separation tool 120*f* can include main body 122, plurality of separation blade slots 134, and plurality of separation blades 124. As illustrated in FIG. 5B, not every separation blade slot 134 needs to house separation blade 124. When separation blade 124 in inserted into a separation blade slot, separation blade slot 134 can hold separation blade 124 and help allow separation blade 124 to separate testing housing 102 and power and signal supply housing 104 without damage.

Figure 6A:
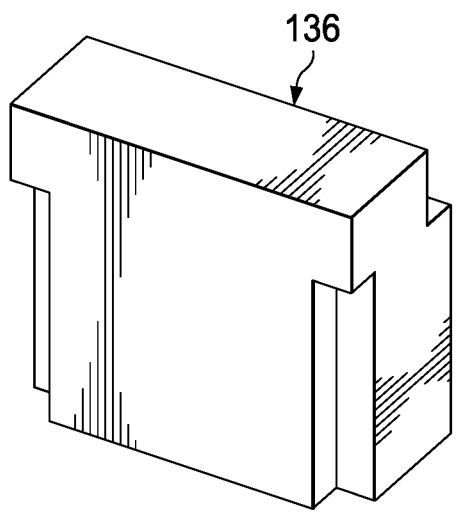
FIG. 6A is a simplified block diagram of a portion of a separation tool, in accordance with an embodiment of the present disclosure.
Figure 6B:
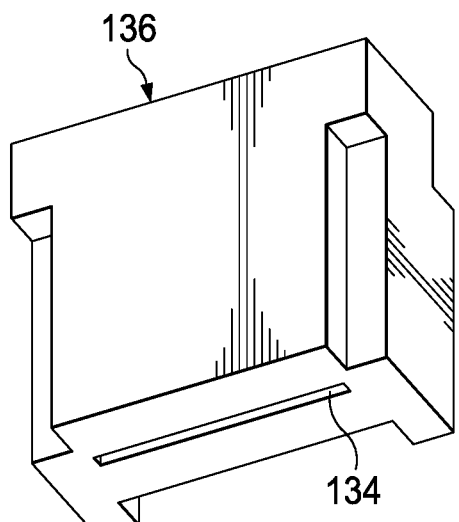
FIG. 6B is a simplified block diagram of a portion of a separation tool, in accordance with an embodiment of the present disclosure.

Turning to FIGS. 6A and 6B, FIGS. 6A and 6B are a simplified block diagram of a portion of a separation tool. In an example, the separation tool can be comprised of segments that can be added or replaced with other different segments. For example, a blade segment 136 is illustrated in FIGS. 6A and 6B. Blade segment 136 can include separation blade slot 134.

Figure 7A:
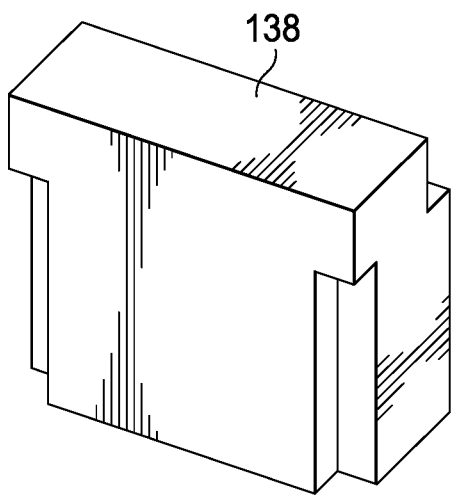
FIG. 7A is a simplified block diagram of a portion of a separation tool, in accordance with an embodiment of the present disclosure.
Figure 7B:
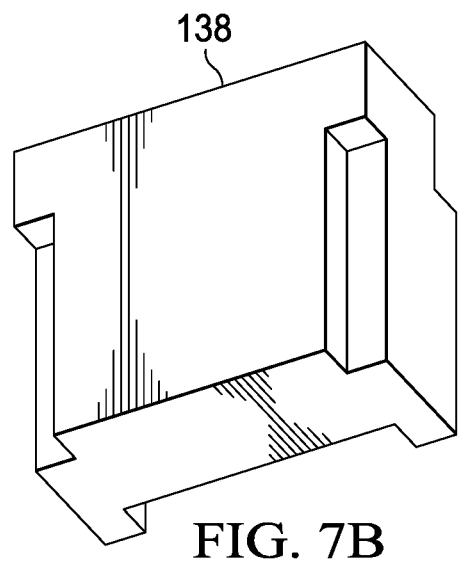
FIG. 7B is a simplified block diagram of a portion of a separation tool, in accordance with an embodiment of the present disclosure.

Turning to FIGS. 7A and 7B, FIGS. 7A and 7B are a simplified block diagram of a portion of a separation tool. In an example, the separation tool can be comprised of segments that can be added or replaced with other different segments. For example, a blank segment 138 is illustrated in FIGS. 7A and 7B. Blank segment 138 does not include separation blade slot 134.

Figure 8A:
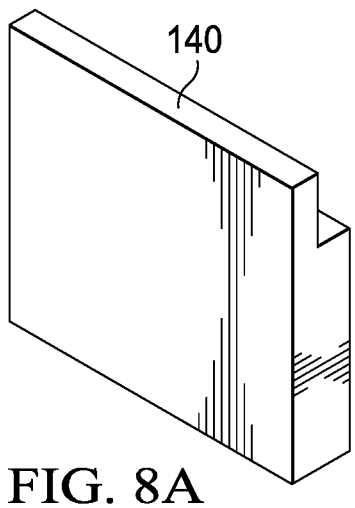
FIG. 8A is a simplified block diagram of a portion of a separation tool, in accordance with an embodiment of the present disclosure.
Figure 8B:
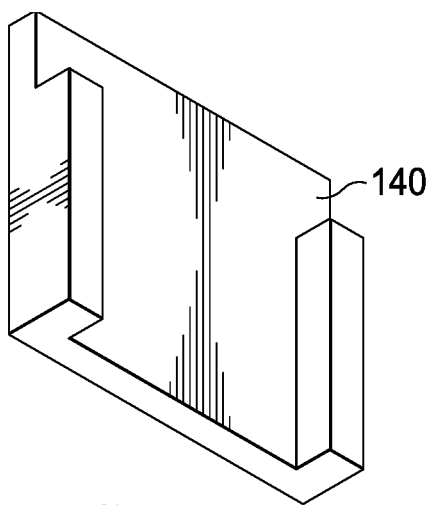
FIG. 8B is a simplified block diagram of a portion of a separation tool, in accordance with an embodiment of the present disclosure.

Turning to FIGS. 8A and 8B, FIGS. 8A and 8B are a simplified block diagram of a portion of a separation tool. In an example, the separation tool can be comprised of segments that can be added or replaced with other different segments. For example, a first end segment 140 is illustrated in FIGS. 8A and 8B. First end segment 140 can be used to complete a separator tool for easier or more intuitive user handling as well as to close off an end for a stronger overall unit with no ingress for foreign particles.

Figure 9A:
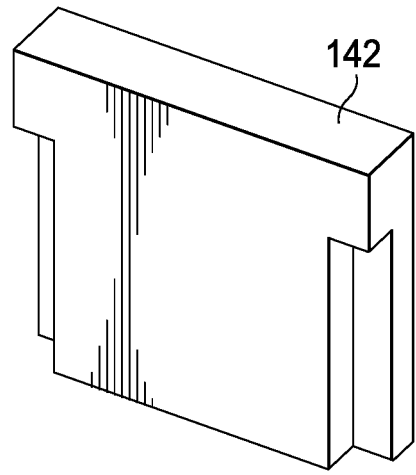
FIG. 9A is a simplified block diagram of a portion of a separation tool, in accordance with an embodiment of the present disclosure.
Figure 9B:
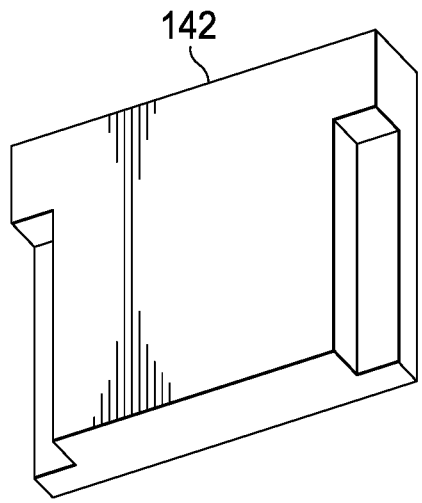
FIG. 9B is a simplified block diagram of a portion of a separation tool, in accordance with an embodiment of the present disclosure.

Turning to FIGS. 9A and 9B, FIGS. 9A and 9B are a simplified block diagram of a portion of a separation tool. In an example, the separation tool can be comprised of segments that can be added or replaced with other different segments. For example, a second end segment 142 is illustrated in FIGS. 9A and 9B. Similar to first end segment 140, second end segment 142 can be used to help complete a separator tool for easier or more intuitive user handling as well as to close off an end for a stronger overall unit with no ingress for foreign particles. In an example, first end segment 140 and second end segment 142 may be marked for male or female polarity and/or to help provide an indicator to identify a right side of the separator tool and a left side of the separator tool and help the user properly line up the blades on the tool with the blade gaps between the plurality of blades in the test housing connection area.

Figure 10A:
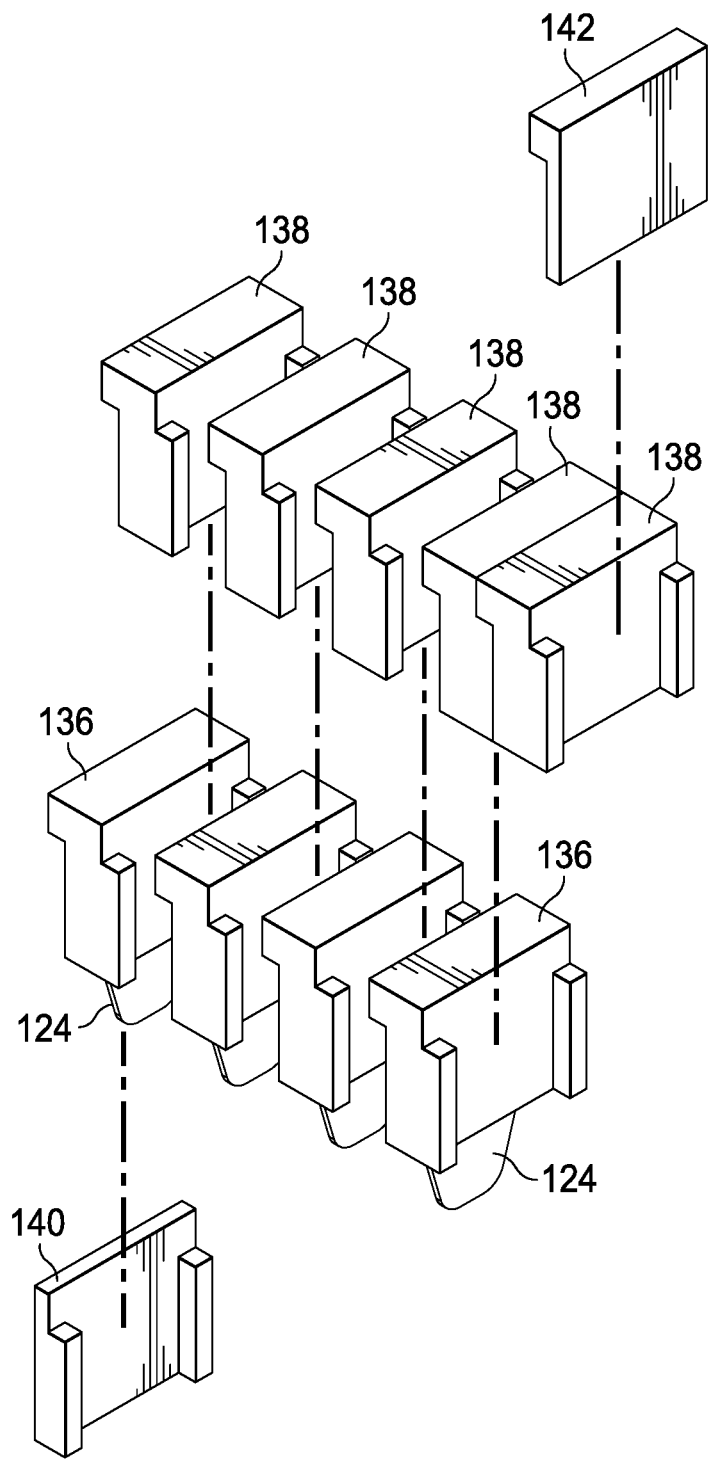
FIG. 10A is a simplified block diagram of a separation tool, in accordance with an embodiment of the present disclosure.
Figure 10B:
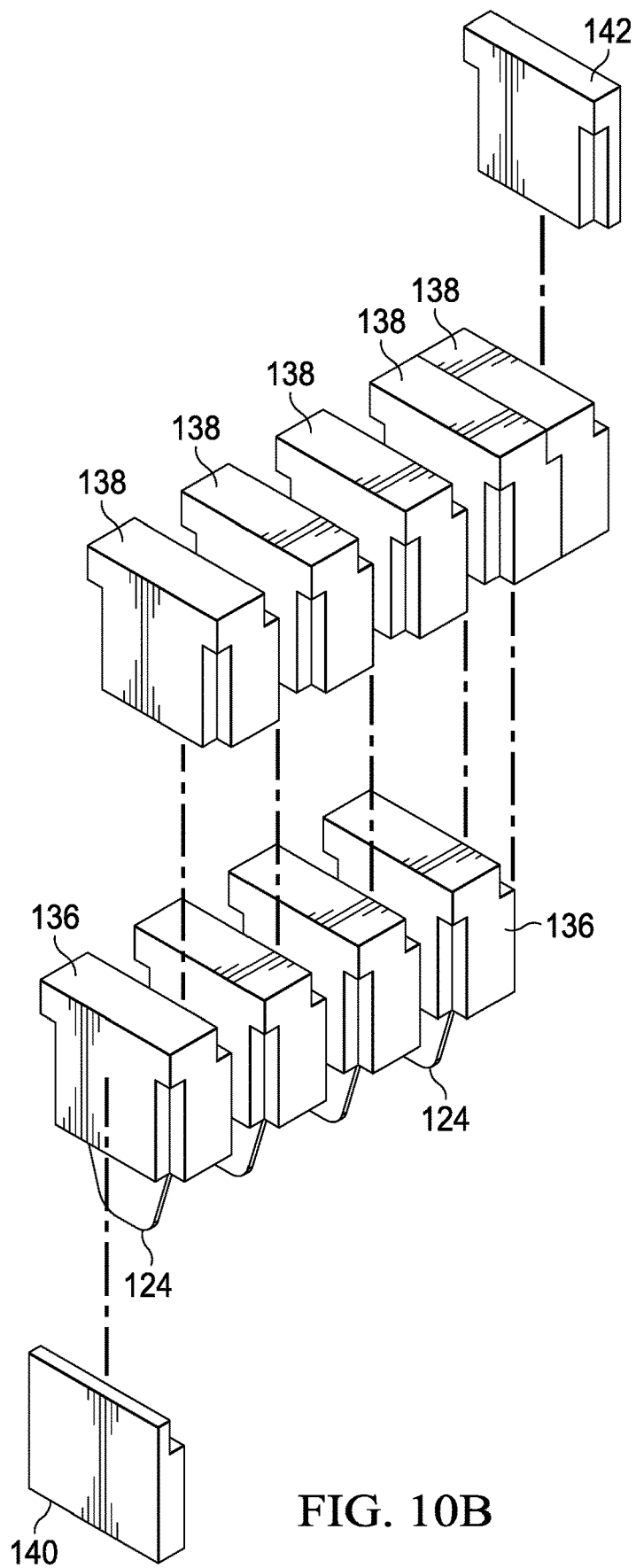
FIG. 10B is a simplified block diagram of a separation tool, in accordance with an embodiment of the present disclosure.

Turning to FIGS. 10A and 10B, FIGS. 10A and 10B are a simplified block diagram of one or more blade segments 136 being coupled with one or more blank segments 138 to create a separation tool. In an example, a blade segment 136 can be coupled to a blank segment 138, a blade segment 136 can be coupled to a blade segment 136, a blank segment 138 can be coupled to a blank segment 138, or any other combination can be used to create a separation tool. After one or more blade segments 136 are coupled with one or more blank segments 138 and/or one or more blade segments 136 to create the separation tool, first end segment 140 and second end segment 142 can be added to help to complete the separator tool for easier or more intuitive user handling as well as to close off the ends for a stronger overall unit with no ingress for foreign particles.

Figure 11A:
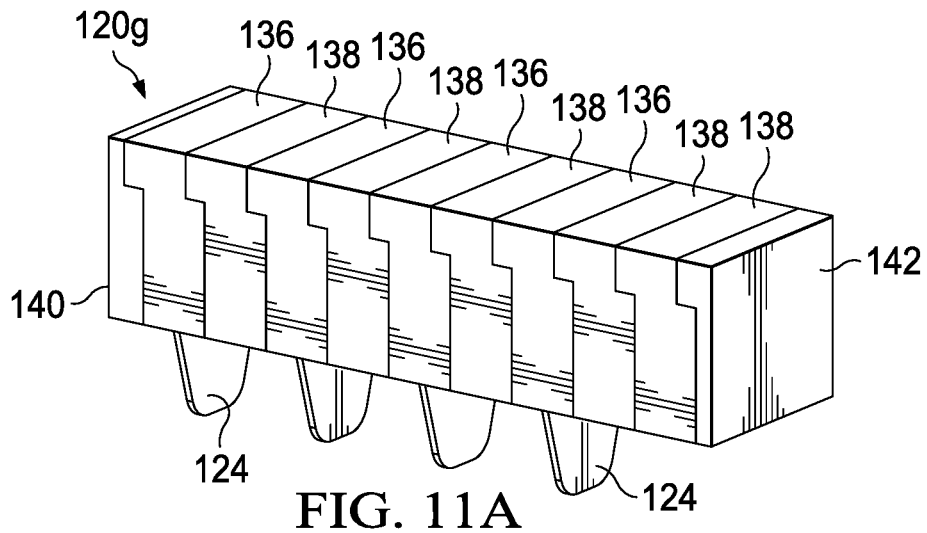
FIG. 11A is a simplified block diagram of a separation tool, in accordance with an embodiment of the present disclosure.
Figure 11B:
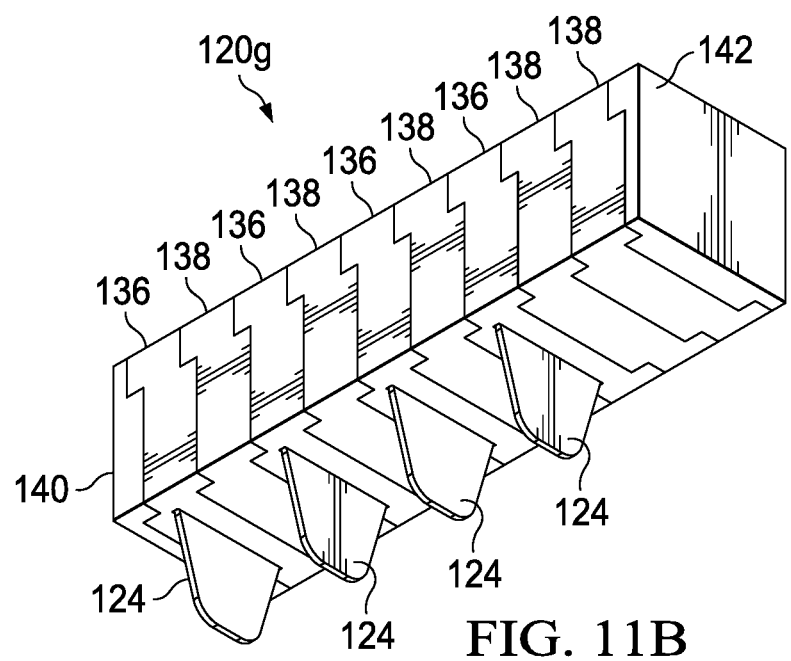
FIG. 11B is a simplified block diagram of a separation tool, in accordance with an embodiment of the present disclosure.

Turning to FIGS. 11A and 11B, FIGS. 11A and 11B are a simplified block diagram of blade segments 136 being coupled with blank segments 138 to create separation tool 120*g*. Separation tool 120*g* can include one blade segment 136 coupled to one blank segment 138 coupled to one blade segment 136 coupled to one blank segment 138 coupled to one blade segment 136 coupled to one blank segment 138 coupled to one blade segment 136 coupled to two blank segments 138. The ends of separation tool 120*g* can be capped with first end segment 140 and second end segment 142. Separation tool 120*g* illustrated in FIGS. 11A and 11B represents one example of how one or more blade segments 136 can be coupled with one or more blank segments 138 to create a separation tool. Other configurations and combinations of one or more blade segments 136 being coupled with one or more blank segments 138 may be used, depending on user preferences and design constraints.

Figure 12A:
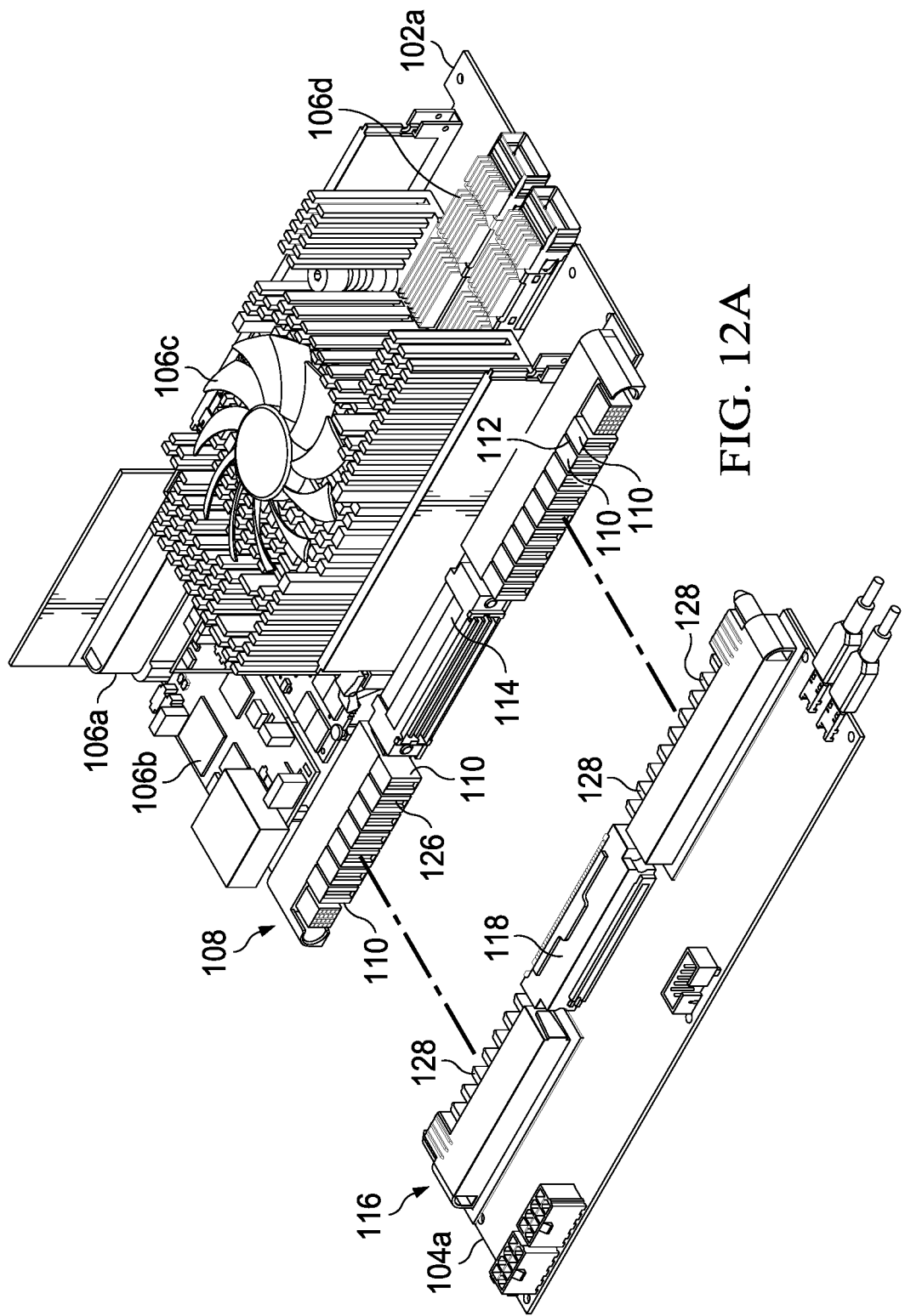
FIG. 12A is a simplified block diagram of a system to enable a separation tool, in accordance with an embodiment of the present disclosure.

Turning to FIG. 12A, FIG. 12A is a simplified block diagram of testing housing 102a being coupled to power and signal supply housing 104a. Testing housing 102a can include one or more testing components 106 and test housing connection area 108. For example, as illustrated in FIG. 12A, testing housing 102a includes testing components 106a-106d. Testing component 106a may be a daughterboard subsystem, testing component 106b may be a processor (e.g., CPU, GPU, FPGA, etc.), testing component 106c may be a fan or some other active cooling element, and testing component 106d may be a network connector.

Test housing connection area 108 can include plurality of blades 110 with blade gap 112 between each of the plurality of blades 110 in test housing connection area 108. Each of blades 110 can include power receiving slot 126. Test housing connection area 108 can also include test housing signal connection 114. Power and signal supply housing 104a can include a power and signal supply connection area 116. Power and signal supply connection area 116 can include supply signal connection 118 and power supply blades 128. Power supply blades 128 can be configured to couple with power receiving slot 126 and help couple and provide power to testing housing 102 from power and signal supply housing 104. Testing housing signal connection 114 can be configured to couple with supply signal connection 118 and help couple and facilitate communications between testing housing 102 and power and signal supply housing 104. The connectors (e.g., blades 110, test housing signal connection 114, power and signal supply connection area 116, power receiving slot 126, power supply blades 128, etc.) for testing housing 102a and power and signal supply housing 104a are typically high power, high density, and have a high connection bond co-planar style. When connected, they require a relatively large amount of uniform force in order to separate them in order to be able to re-use testing housing 102a and power and signal supply housing 104a.

Figure 12B:
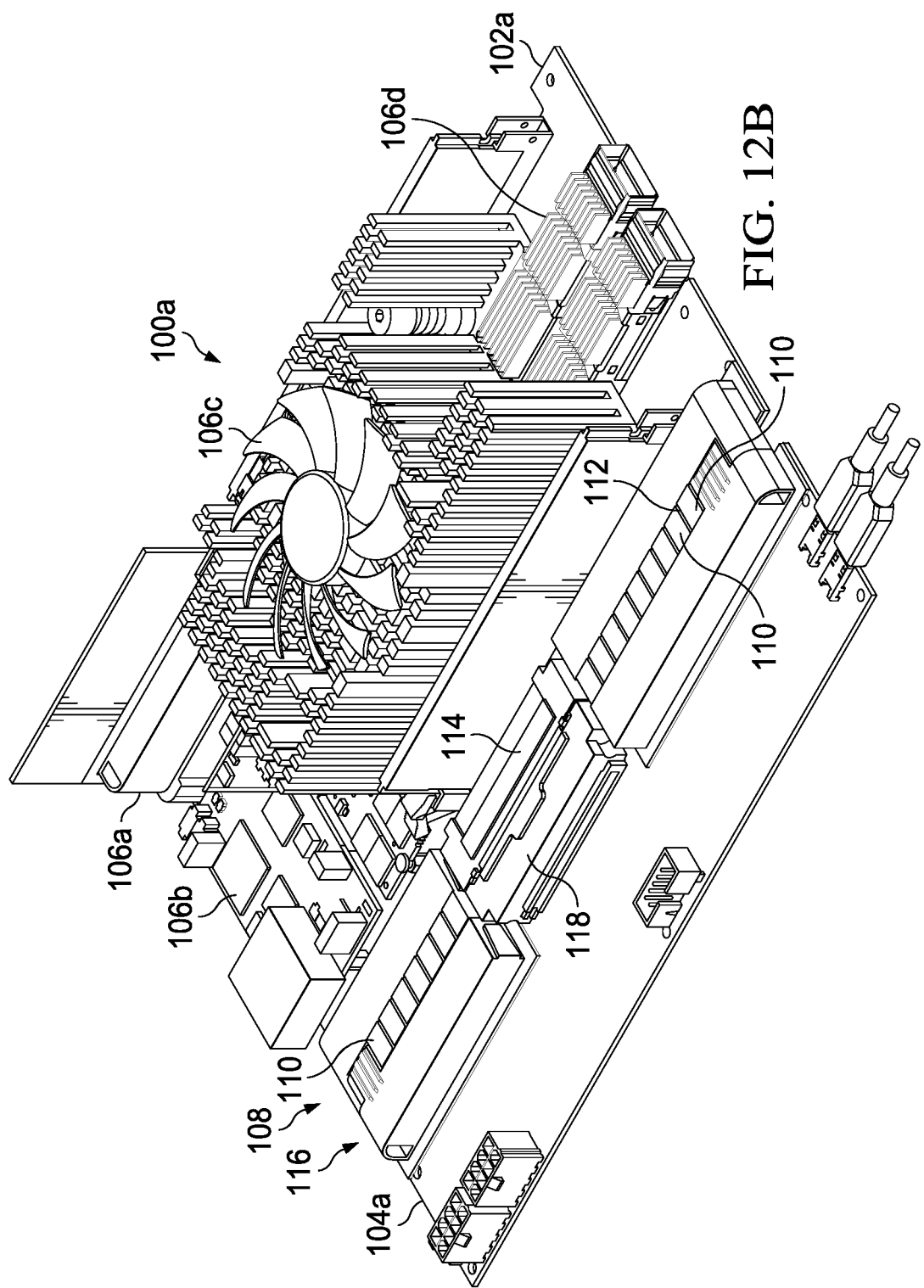
FIG. 12B is a simplified block diagram of a system to enable a separation tool, in accordance with an embodiment of the present disclosure.

Turning to FIG. 12B, FIG. 12B is a simplified block diagram of testing housing 102a coupled to power and signal supply housing 104a to create electronic device 100a. Testing housing 102a can include one or more testing components 106 and test housing connection area 108. For example, as illustrated in FIG. 12B, testing housing 102a includes testing components 106a-106d. Test housing connection area 108 can include a plurality of blades 110 with blade gap 112 between each of the plurality of blades 110 in test housing connection area 108. Test housing connection area 108 can also include test housing signal connection 114. Power and signal supply housing 104a can include power and signal supply connection area 116. Power and signal supply connection area 116 can include supply signal connection 118. The connectors (e.g., blades 110, test housing signal connection 114, power and signal supply connection area 116, power receiving slot 126, power supply blades 128, etc.) for testing housing 102a and power and signal supply housing 104a are typically high power, high density, and have a high connection bond co-planar style. When connected as illustrated in FIG. 12B, they require a relatively large amount of uniform force in order to separate them in order to be able to re-use testing housing 102a and power and signal supply housing 104a.

Figure 12C:
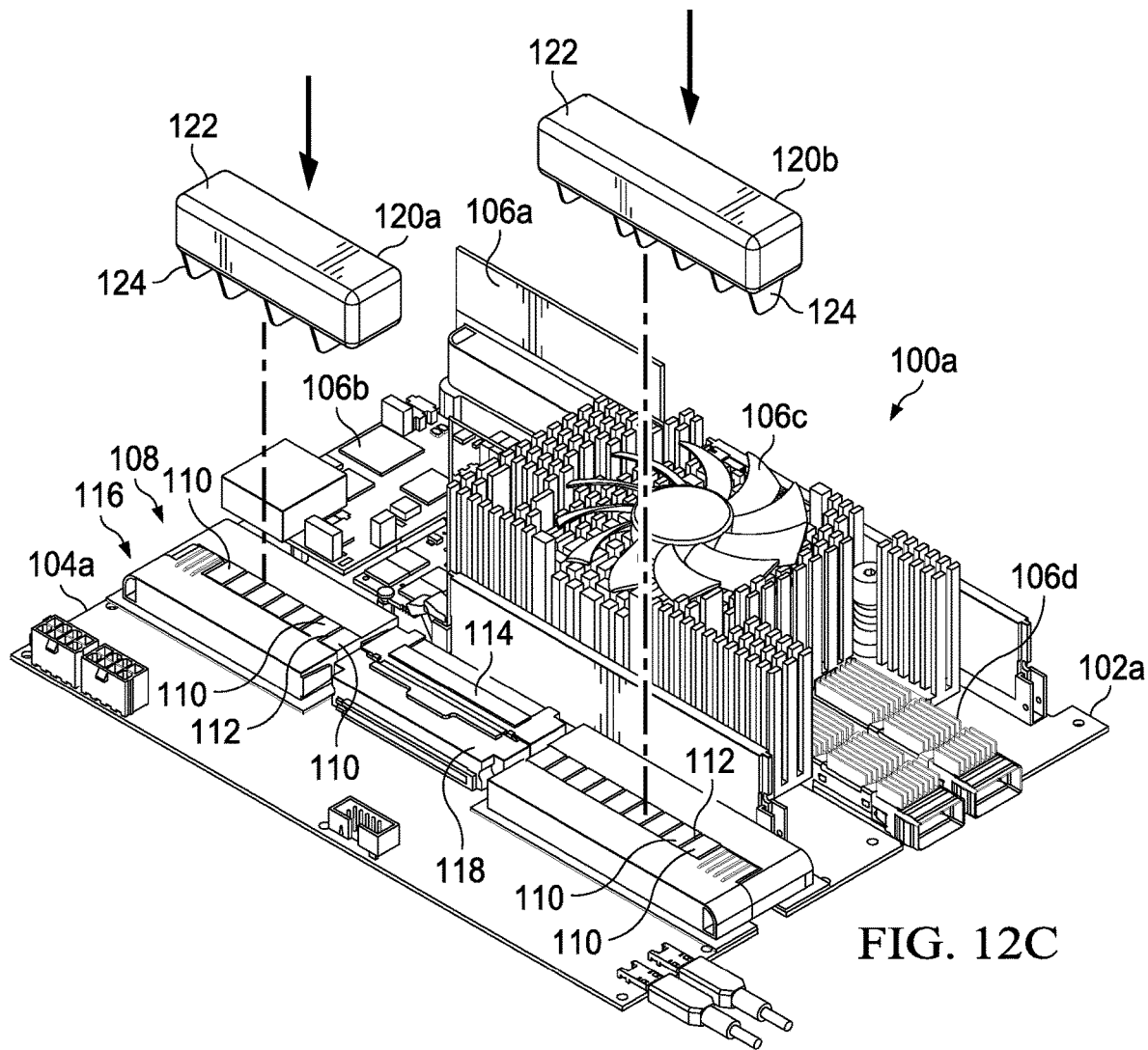
FIG. 12C is a simplified block diagram of a system to enable a separation tool, in accordance with an embodiment of the present disclosure.

Turning to FIG. 12C, FIG. 12C is a simplified block diagram of testing housing 102a coupled to power and signal supply housing 104a to create electronic device 100a. Testing housing 102a can include one or more testing components 106 and test housing connection area 108. For example, as illustrated in FIG. 12B, testing housing 102a includes testing components 106a-106d. Test housing connection area 108 can include plurality of blades 110 with blade gap 112 between each of the plurality of blades 110 in test housing connection area 108. Test housing connection area 108 can also include test housing signal connection 114. Power and signal supply housing 104 can include a power and signal supply connection area 116. Power and signal supply connection area 116 can include supply signal connection 118. The connectors (e.g., blades 110, test housing signal connection 114, power and signal supply connection area 116, power receiving slot 126, power supply blades 128, etc.) for testing housing 102a and power and signal supply housing 104a are typically high power, high density, and have a high connection bond co-planar style. When connected as illustrated in FIG. 12C, they require a relatively large amount of uniform force in order to separate them in order to be able to re-use testing housing 102a and power and signal supply housing 104a. When test housing connection area 108 on testing housing 102a is coupled to power and signal supply connection area 116 on power and signal supply housing 104a, the connection can be relatively strong and often it is difficult to separate testing housing 102a and power and signal supply housing 104a without damaging connections in power and signal supply connection area 116. In an example, a separation tool can be used to help separate testing housing 102a and power and signal supply housing 104a without damaging connections in power and signal supply connection area 116.

As illustrated in FIG. 12C, separation tools 120a and 120b can be used to help separate testing housing 102a and power and signal supply housing 104a without damaging connections in power and signal supply connection area 116. Each of separation tools 120a and 120b can include main body 122 and plurality of separation blades 124. Each of plurality of separation blades 124 can be configured to be inserted into a specific blade gap 112 between plurality of blades 110 in test housing connection area 108.

Figure 12D:
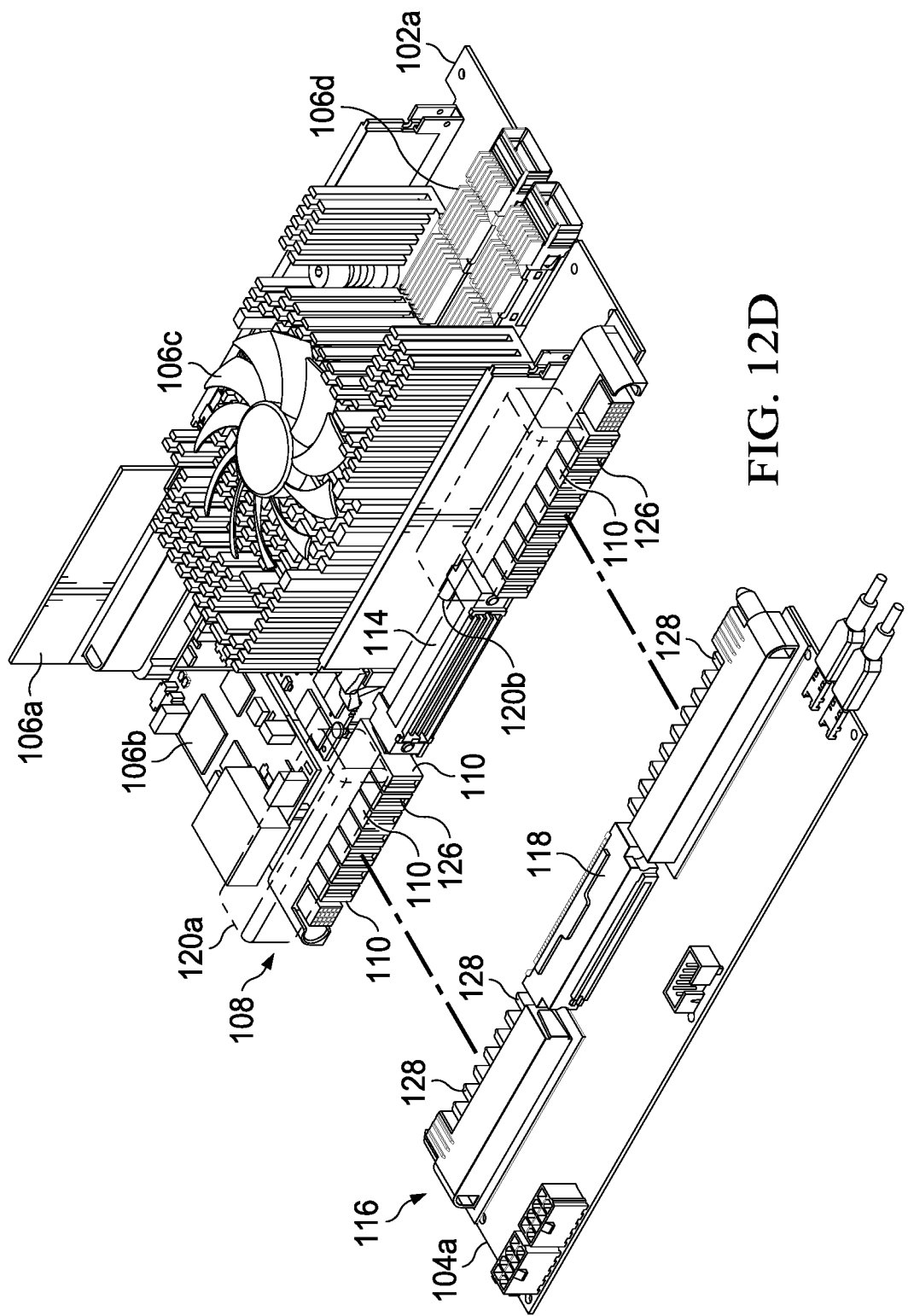
FIG. 12D is a simplified block diagram of a system to enable a separation tool, in accordance with an embodiment of the present disclosure.

Turning to FIG. 12D, FIG. 12D is a simplified block diagram of testing housing 102a being separated from power and signal supply housing 104a. Testing housing 102a can include one or more testing components 106 and test housing connection area 108. For example, as illustrated in FIG. 12D, testing housing 102a includes testing components 106a-106d. Test housing connection area 108 can include plurality of blades 110 with blade gap 112 between each of the plurality of blades 110 in test housing connection area 108. Each of blades 110 can include power receiving slot 126. Test housing connection area 108 can also include test housing signal connection 114. Power and signal supply housing 104a can include a power and signal supply connection area 116. Power and signal supply connection area 116 can include supply signal connection 118 and power supply blades 128. When each of plurality of separation blades 124 on separation tools 120a and 120b are inserted into a blade gap (e.g., blade gap 112) between blades 110 in test housing connection area 108 and downward pressure is applied to main body 122 of separation tools 120a and 120b, testing housing 102a and power and signal supply housing 104a can be separated without damaging connections in power and signal supply connection area 116.

Figure 12E:
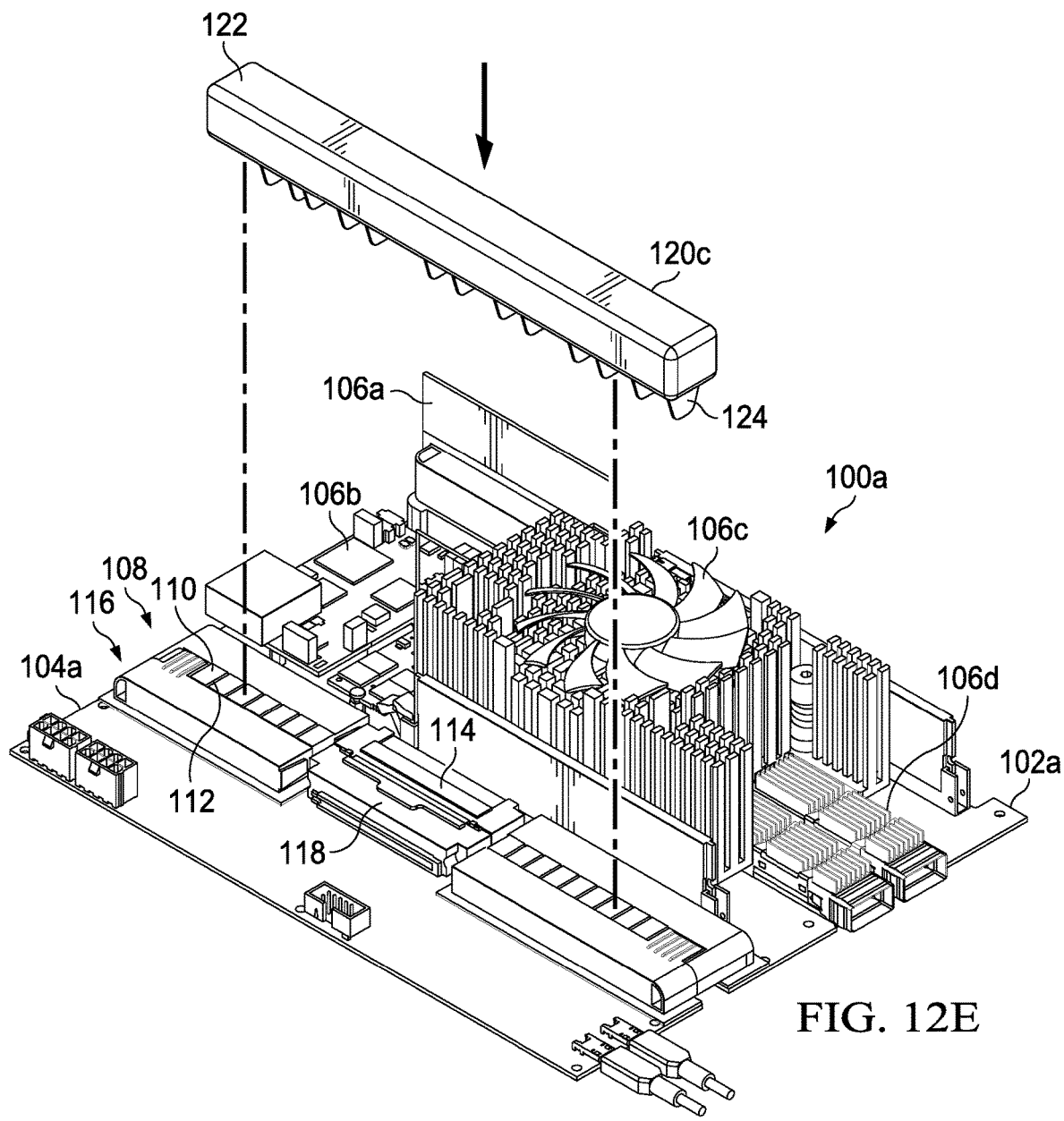
FIG. 12E is a simplified block diagram of a system to enable a separation tool, in accordance with an embodiment of the present disclosure.

Turning to FIG. 12E, FIG. 12E is a simplified block diagram of testing housing 102a coupled to power and signal supply housing 104a to create electronic device 100a.

Testing housing 102a can include one or more testing components 106 and test housing connection area 108. For example, as illustrated in FIG. 12E, testing housing 102a includes testing components 106a-106d. Test housing connection area 108 can include plurality of blades 110 with blade gap 112 between each of the plurality of blades 110 in test housing connection area 108. Test housing connection area 108 can also include test housing signal connection 114. Power and signal supply housing 104 can include power and signal supply connection area 116. Power and signal supply connection area 116 can include supply signal connection 118. The connectors (e.g., blades 110, test housing signal connection 114, power and signal supply connection area 116, power receiving slot 126, power supply blades 128, etc.) for testing housing 102a and power and signal supply housing 104a are typically high power, high density, and have a high connection bond co-planar style. When connected as illustrated in FIG. 12E, they require a relatively large amount of uniform force in order to separate them in order to be able to re-use testing housing 102a and power and signal supply housing 104a. When test housing connection area 108 on testing housing 102a is coupled to power and signal supply connection area 116 on power and signal supply housing 104a, the connection can be relatively strong and often it is difficult to separate testing housing 102a and power and signal supply housing 104a without damaging connections in power and signal supply connection area 116. In an example, a separation tool can be used to help separate testing housing 102a and power and signal supply housing 104a without damaging connections in power and signal supply connection area 116.

As illustrated in FIG. 12E, separation tool 120c can be used to help separate testing housing 102a and power and signal supply housing 104a without damaging connections in power and signal supply connection area 116. Separation tool 120c can include main body 122 and plurality of separation blades 124. Each of plurality of separation blades 124 can be configured to be inserted into blade gap 112 between blades 110 in test housing connection area 108.

Figure 12F:
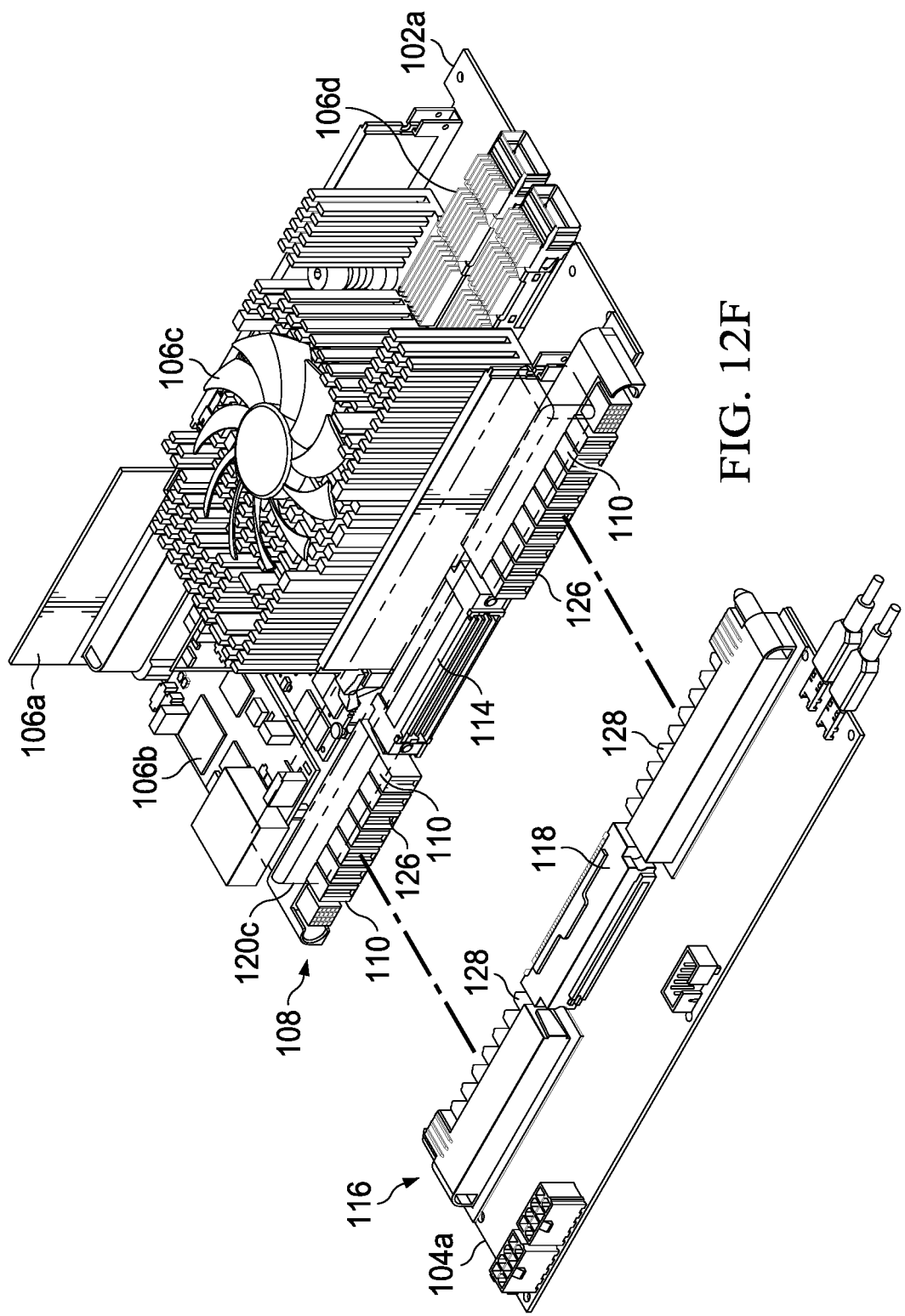
FIG. 12F is a simplified block diagram of a system to enable a separation tool, in accordance with an embodiment of the present disclosure.

Turning to FIG. 12F, FIG. 12F is a simplified block diagram of testing housing 102a being separated from power and signal supply housing 104a. Testing housing 102a can include one or more testing components 106 and test housing connection area 108. For example, as illustrated in FIG. 12A, testing housing 102a includes testing components 106a-106d. Test housing connection area 108 can include plurality of blades 110 with blade gap 112 between each of the plurality of blades 110 in test housing connection area 108. Each of blades 110 can include power receiving slot 126. Test housing connection area 108 can also include test housing signal connection 114. Power and signal supply housing 104 can include power and signal supply connection area 116. Power and signal supply connection area 116 can include supply signal connection 118 and power supply blades 128. When each of plurality of separation blades 124 on separation tool 120c are inserted into a blade gap (e.g., blade gap 112) between plurality of blades 110 in test housing connection area 108 and downward pressure is applied to main body 122 of separation tool 120c, testing housing 102 and power and signal supply housing 104 can be separated without damaging connections in power and signal supply connection area 116.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although segmented heatsinks 106a-106f been illustrated with reference to particular elements and operations, these elements and operations may be replaced by any suitable architecture, profile, geometry, and/or configuration that achieves the intended functionality of separation tools 120a-120c.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, a separation tool for separating a testing housing from a power and signal supply housing. The separation tool can include a main body and a plurality of separation blades that extend from the main body, wherein the separation blades are configured to fit between connections of the testing housing and the power and signal supply housing.

In Example A2, the subject matter of Example A1 can optionally include where each of the plurality of separation blades are tapered.

In Example A3, the subject matter of any one of Examples A1-A2 can optionally include where the plurality of separation blades can be removed from the main body.

In Example A4, the subject matter of any one of Examples A1-A3 can optionally include where the separation tool includes a second separate main body and a second plurality of separation blades that extend from the second separate main body.

In Example A5, the subject matter of any one of Examples A1-A4 can optionally include where the connections of the testing housing and the power and signal supply housing include power supply blades coupled with power receiving slots.

In Example A6, the subject matter of any one of Examples A1-A5 can optionally include where the main body is modular and includes a plurality of blade segments and a plurality of blank segments.

Example M1 is a method including coupling a testing housing to a power and signal supply housing, and separating the testing housing from the power and signal supply housing using a separation tool. The separation tool includes a main body and a plurality of separation blades that extend from the main body, wherein the separation blades are configured to fit between connections of the testing housing and the power and signal supply housing.

In Example M2, the subject matter of Example M1 can optionally include where the testing housing includes one or more testing components and the power and signal supply housing supplies power and signals to the testing components.

In Example M3, the subject matter of any one of the Examples M1-M2 can optionally include where each of the plurality of separation blades are tapered.

In Example M4, the subject matter of any one of the Examples M1-M3 can optionally include where the plurality of separation blades can be removed from the main body.

In Example M5, the subject matter of any one of the Examples M1-M4 can optionally include where the separation tool includes a second separate main body and a second plurality of separation blades that extend from the second separate main body.

In Example M6, the subject matter of any one of the Examples M1-M5 can optionally include where the connections of the testing housing and the power and signal supply housing include power supply blades coupled with power receiving slots.

In Example M7, the subject matter of any one of the Examples M1-M6 can optionally include where the main body is modular and includes a plurality of blade segments and a plurality of blank segments.

In Example M8, the subject matter of any one of the Examples M1-M7 can optionally include recoupling the power and signal supply housing to a second testing housing Example AA1 is a modular system for testing components. The modular system can include a testing housing, a power and signal supply housing, wherein the power and signal supply housing is configured to couple to the testing housing, and a separation tool, wherein the separation tool is configured to separate the testing housing from the power and signal supply housing. The separation tool includes a main body and a plurality of separation blades that extend from the main body, wherein the separation blades are configured to fit between connections of the testing housing and the power and signal supply housing.

In Example AA2, the subject matter of Example AA1 can optionally include where the testing housing includes one or more testing components and the power and signal supply housing supplies power and signals to the testing components.

In Example AA3, the subject matter of any one of the Examples AA1-AA2 can optionally include where the one or more testing components can be removed and replaced with a different testing component and the power and signal supply housing can be recoupled to a new testing housing with the different testing component.

In Example AA4, the subject matter of any one of the Examples AA1-AA3 can optionally include where each of the plurality of separation blades are tapered.

In Example AA5, the subject matter of any one of the Examples AA1-AA4 can optionally include where the plurality of separation blades can be removed from the main body.

In Example AA6, the subject matter of any one of the Examples AA1-AA5 can optionally include where the main body is modular and includes a plurality of blade segments and a plurality of blank segments.

What is claimed is:

1. A separation tool for separating a testing housing from a power and signal supply housing, the separation tool comprising:
    a main body, wherein the main body is modular and includes a plurality of blade segments and a plurality of blank segments; and
    a plurality of separation blades that extend from the plurality of blade segments, wherein the separation blades are configured to fit between connections of the testing housing and the power and signal supply housing.

2. The separation tool of claim 1, wherein each of the plurality of separation blades are tapered.

3. The separation tool of claim 1, wherein the plurality of separation blades can be removed from the main body.

4. The separation tool of claim 1, wherein the separation tool includes a second separate main body and a second plurality of separation blades that extend from the second separate main body.

5. The separation tool of claim 1, wherein the connections of the testing housing and the power and signal supply housing include power supply blades coupled with power receiving slots.

6. A method comprising:
    coupling a testing housing to a power and signal supply housing, wherein connections of the testing housing and the power and signal supply housing include power supply blades coupled with power receiving slots; and
    separating the testing housing from the power and signal supply housing using a separation tool, wherein the separation tool includes:
        a main body; and
        a plurality of separation blades that extend from the main body, wherein the separation blades are configured to fit between the connections of the testing housing and the power and signal supply housing.

7. The method of claim 6, wherein the testing housing includes one or more testing components and the power and signal supply housing supplies power and signals to the testing components.

8. The method of claim 6, wherein each of the plurality of separation blades are tapered.

9. The method of claim 6, wherein the plurality of separation blades can be removed from the main body.

10. The method of claim 6, wherein the separation tool includes a second separate main body and a second plurality of separation blades that extend from the second separate main body.

11. The method of claim 6, wherein the main body is modular and includes a plurality of blade segments and a plurality of blank segments.

12. The method of claim 6, further comprising:
    recoupling the power and signal supply housing to a second testing housing.

13. A modular system for testing components, the modular system comprising:
    a testing housing, wherein the testing housing includes one or more testing components;
    a power and signal supply housing, wherein the power and signal supply housing is configured to couple to the testing housing and supply power and signals to the one or more testing components; and
    a separation tool, wherein the separation tool is configured to separate the testing housing from the power and signal supply housing, wherein the separation tool includes:
        a main body; and
        a plurality of separation blades that extend from the main body, wherein the separation blades are configured to fit between connections of the testing housing and the power and signal supply housing, wherein the one or more testing components can be removed and replaced with a different testing component and the power and signal supply housing can be recoupled to a new testing housing with the different testing component.

14. The modular system for testing components of claim 13, wherein each of the plurality of separation blades are tapered.

15. The modular system for testing components of claim 13, wherein the plurality of separation blades can be removed from the main body.

16. The modular system for testing components of claim 15, wherein the main body is modular and includes a plurality of blade segments and a plurality of blank segments.

* * * * *